US006914334B2

(12) United States Patent
Li et al.

(10) Patent No.: US 6,914,334 B2
(45) Date of Patent: Jul. 5, 2005

(54) CIRCUIT BOARD WITH TRACE CONFIGURATION FOR HIGH-SPEED DIGITAL DIFFERENTIAL SIGNALING

(75) Inventors: Yuan-Liang Li, Chandler, AZ (US); Jiangqi He, Chandler, AZ (US); Dong Zhong, Chandler, AZ (US); David G. Figueroa, Mesa, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/167,904

(22) Filed: Jun. 12, 2002

(65) Prior Publication Data

US 2003/0230807 A1 Dec. 18, 2003

(51) Int. Cl.[7] .............................................. H01L 23/48
(52) U.S. Cl. ........................ 257/752; 257/758; 361/792; 174/255
(58) Field of Search ................................. 257/752, 758, 257/776, 766; 438/626, 631, 645, 280; 361/792–795; 174/255, 261

(56) References Cited

U.S. PATENT DOCUMENTS

| | | | | |
|---|---|---|---|---|
| 4,712,161 A | * | 12/1987 | Pryor et al. ................. | 361/779 |
| 5,408,053 A | * | 4/1995 | Young ........................ | 174/264 |
| 6,292,153 B1 | * | 9/2001 | Aiello et al. ................ | 343/767 |

\* cited by examiner

*Primary Examiner*—Nathan J. Flynn
*Assistant Examiner*—Leonardo Andújar
(74) *Attorney, Agent, or Firm*—Schwegman, Lundberg, Woessner & Kluth, P.A.

(57) ABSTRACT

Trace configurations for carrying high-speed digital differential signals provide for reduced conduction loss and improved signal integrity. In one embodiment, a circuit board has a first set of conductive traces disposed on non-conductive material, and a second set of conductive traces parallel to the first set and disposed within the conductive material. The second set is separated from the first set by non-conductive material. Corresponding traces of the first and second sets may be in a stacked configuration. In other embodiments, conductive material may be provided between corresponding traces of the first and second sets resulting in an "I-shaped" or "U-shaped" cross-section. In yet other embodiments, the trace configurations have "T-shaped" and "L-shaped" cross-sections.

8 Claims, 4 Drawing Sheets

US 6,914,334 B2

CIRCUIT BOARD WITH TRACE CONFIGURATION FOR HIGH-SPEED DIGITAL DIFFERENTIAL SIGNALING

FIELD OF THE INVENTION

The present invention pertains to high-speed digital differential signaling and in one embodiment, to circuit boards with traces for communicating high-speed digital differential signals.

BACKGROUND OF THE INVENTION

Digital signals, including digital differential signals, are used for signal transmission on circuit boards, integrated circuit packages, interposer substrates and motherboards to help protect a signal from picking up external noise. Digital differential signals are also used in computer systems and communication systems such as a local area network (LAN) system. A digital differential signal has two components that are 180 degrees out-of-phase with each other. The signal components transition between digital values of zero and one which may be represented by particular voltages. Digital differential signals are conventionally transmitted using a pair of traces spaced closely together on a circuit board or substrate. Each trace of the pair carries one of the components of the digital differential signal. FIG. 1 illustrates a cross-section of a portion of a circuit board with a pair of traces for communicating digital differential signals in accordance with the prior art. Circuit board 100 has trace pair 102 on insulating substrate 104. Conductive ground plane 106 is on a side of substrate 104 opposite to traces 102. Trace pair 102 illustrates a pair of closely spaced traces that have been conventionally used to carry digital differential signals. Because the signal components are out-of-phase, coupling between the traces reduces the signal's susceptibility to external noise. The darkened/solid areas (e.g., trace pairs 102 and ground plane 106) illustrated in the informal drawings are conductive material while the non-darkened areas may be a non-conductive or insulating material.

Semiconductor devices, computers, and other elements in digital systems continue to increase their operating data rate requiring the communication of digital differential signals of increasingly higher transition-rates. The transition-rate refers to the rate at which a digital signal transitions between states. In the near future, digital devices may require high-speed input/output (I/O) communications using digital differential signals, which may exceed rates of one giga-transition per second, and even rates of even ten giga-transition per second. One problem with conventional circuit board trace pairs is that as the transition-rate increases, conduction loss also increases. Furthermore, as the transition-rate increases, signal integrity degrades. Conventional circuit board trace pairs for carrying digital differential signals may have upper limits of less than one or ten giga-transitions per second and are therefore generally unsuitable for carrying higher rate digital differential signals. Digital differential signals above one and especially above ten giga-transitions per second when communicated over conventional trace pairs result in unacceptably high conduction loss and reduction in signal quality and integrity.

One technique that has been used to help reduce the increase in conduction loss associated with high transition-rate digital differential signals is increasing the trace width. Increased trace widths, however, reduce signal routing ability and consume more area on a circuit board, substrate or package, for example. Increased trace width also results in higher dielectric loss due to increased capacitance, which contributes to the reduction in signal quality and integrity.

Thus there is a need for improved communication of high-speed digital differential signals. There is also a need for a circuit board having traces suitable for communication of high-speed digital differential signals. There is also a need for traces for communicating high-speed digital differential signals with reduced conduction loss. There is also a need for traces for communicating high-speed digital differential signals with reduced dielectric loss. There is also a need for traces for communicating high-speed digital differential signals that help maintain signal integrity.

BRIEF DESCRIPTION OF THE DRAWINGS

The invention is pointed out with particularity in the appended claims. However, a more complete understanding of the present invention may be derived by referring to the detailed description when considered in connection with the figures, wherein like reference numbers refer to similar items throughout the figures and:

The description set out herein illustrates the various embodiments of the invention and such description is not intended to be construed as limiting in any manner.

DETAILED DESCRIPTION

Figure 2:
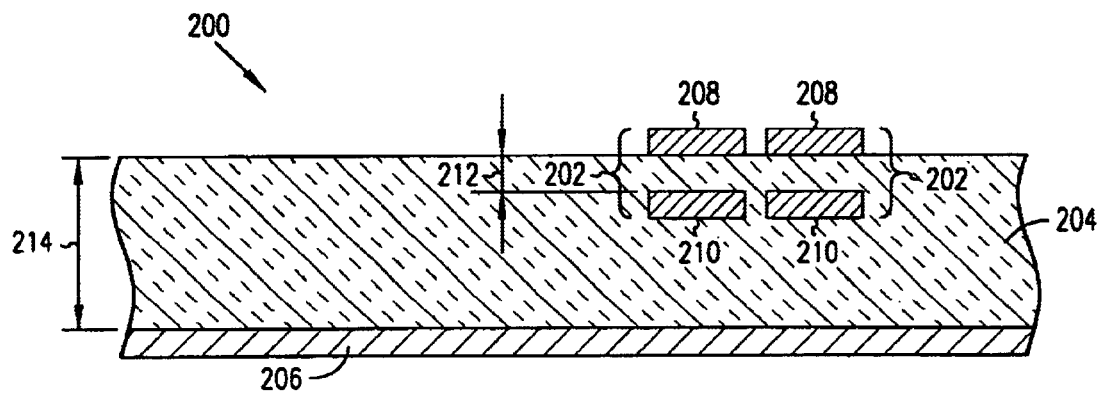
FIGS. 2, 3, 4, 5 and 6 illustrate cross-sections of a circuit board for communicating high-speed digital differential signals in accordance with various embodiment of the present invention.

The present invention relates to circuit boards having traces for communicating digital signals, and in at least one embodiment, relates to circuit boards having traces for communicating high-speed digital signals and high speed digital differential signals. High-speed digital signals may include signals having transition rates up to and exceeding one giga-transition per second, and may even include signals having transition rates of greater than ten giga-transitions per second. Although this detailed description specifically refers to several embodiments of the present invention for communication of digital differential signals, these embodiments are equally suitable to the communication of other types of digital signals, including signals which do not have out-of-phase components. FIG. 2 illustrates a cross-section of a portion of a circuit board having traces for communicating high-speed digital differential signals in accordance with one embodiment of the present invention. Circuit board 200 includes insulating substrate 204 having a pair of traces 202 and conductive ground plane 206. Ground plane 206 is located on a side of insulating substrate 204 opposite to trace pair 202.

In the embodiment illustrated in FIG. 2, trace pair 202 includes first set of conductive traces 208 disposed on a surface of substrate 204, and second set of conductive traces 210 which may be parallel to first set 208 and disposed within non-conductive material. Second set 210 is separated from first set 208 by the insulating material of substrate 204.

In the illustrated embodiment, corresponding traces of first and second sets 208, 210 are in a stacked configuration and are referred to as the "stacked trace" embodiments of the present invention. The ends of each trace of pair 202 may be electrically coupled together so that the corresponding traces of the pair function substantially as one conductor. The corresponding traces of pair 202 may carry a component of a high-speed digital differential signal.

The dielectric constant (Er) of substrate 204 may be increased over that of conventional circuit board substrates to compensate for the closer proximity of traces of set 210 to ground plane 206. The dielectric constant of substrate 204 may, for example, range at least between 3 and 4, although substrates and insulating materials having other dielectric constants may be equally suitable. In the example illustrated, thickness 214 of substrate 206 may, for example, range between 20 and 40 microns, width of traces of sets 208 and 210 may range, for example, between 20 and 40 microns, and thickness of traces of sets 208 and 210 may range, for example, between 10 and 20 microns. Spacing 212 between traces of sets 208 and 210 may, for example, be on the order of ten microns or less. The present invention is equally suitable to circuit boards and traces having different dimensions and characteristics.

Figure 3:
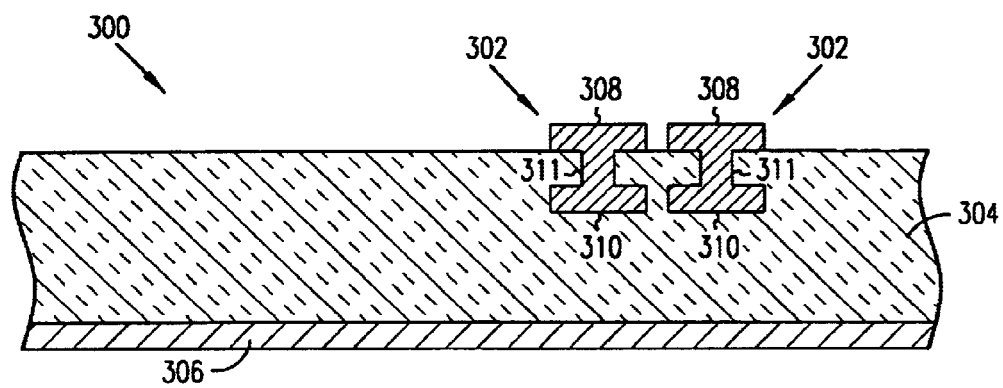

FIG. 3 illustrates a cross-section of a portion of a circuit board having traces for communicating high-speed digital differential signals in accordance with another embodiment of the present invention. Circuit board 300 includes insulating substrate 304 having trace pair 302 and conductive ground plane 306. Ground plane 306 is located on a side of insulating substrate 304 opposite to trace pair 302. Trace pair 302 is comprised of trace sets 308 and 310 coupled with conductive material 311. The embodiment of the present invention illustrated in FIG. 3 is similar to circuit board 200 (FIG. 2) except that traces of sets 308 and 310 are coupled by conductive material 311. Conductive material 311 may run the length of trace pair 302. This embodiment of the present invention is referred to as the "I-shaped" embodiment because the cross-section of the traces of pair 302 is similar to a capital "I". Traces of sets 308 and 310 may be spaced closely together, and may be separated by a thin layer of insulating material.

Figure 4:
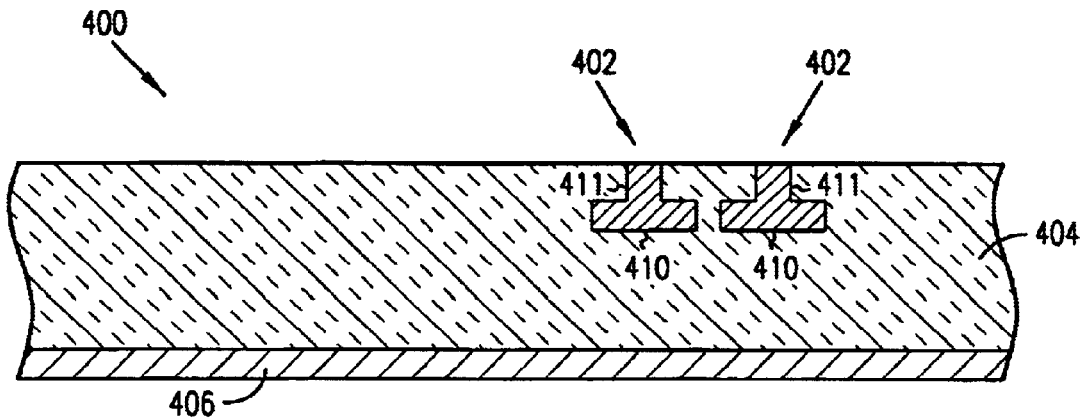

FIG. 4 illustrates a cross-section of a portion of a circuit board having traces for communicating high-speed digital differential signals in accordance with another embodiment of the present invention. Circuit board 400 includes insulating substrate 404 having trace pair 402 and conductive ground plane 406. Trace pair 402 includes trace set 410 located within substrate 404, and conductive portions 411 which may couple traces of set 410 throughout their length. Conductive portions 411 may have a portion exposed on the surface of substrate 404. This embodiment of the present invention is referred to as the "T-shaped" embodiment because the cross-section of the traces of pair 402 is similar to an inverted capital "T".

Figure 5:
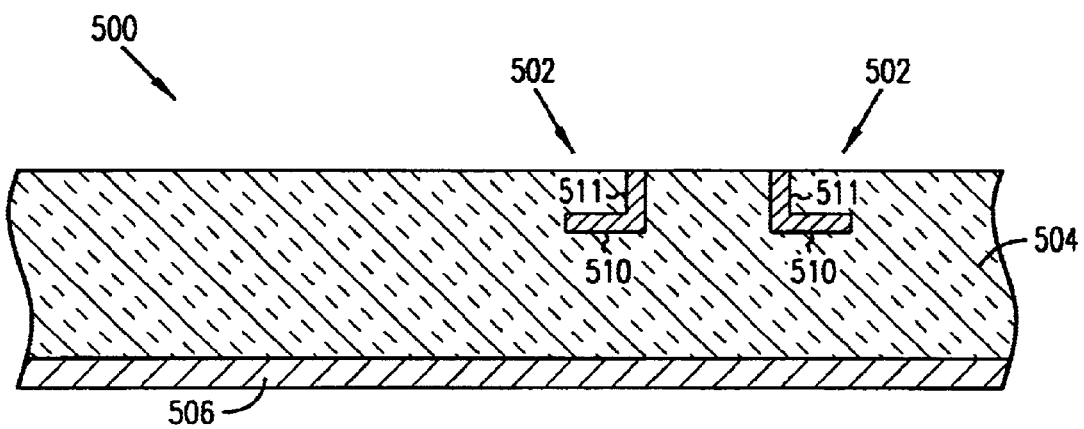

FIG. 5 illustrates a cross-section of a portion of a circuit board having traces for communicating high-speed digital differential signals in accordance with another embodiment of the present invention. Circuit board 500 includes insulating substrate 504 having trace pair 502 and conductive ground plane 506. Trace pair 502 includes trace set 510 located within substrate 504, and conductive portions 511 which may couple traces of set 510 throughout their length. Conductive portions 511 may have a portion exposed on the surface of substrate 504. This embodiment of the present invention is referred to as the "L-shaped" embodiment because the cross-section of the traces of pair 502 is similar to a capital "L". In this embodiment, conductive portions 511 may be positioned on the near sides of traces 510 as illustrated, or alternatively may be positioned on the far sides of traces 510.

Figure 6:
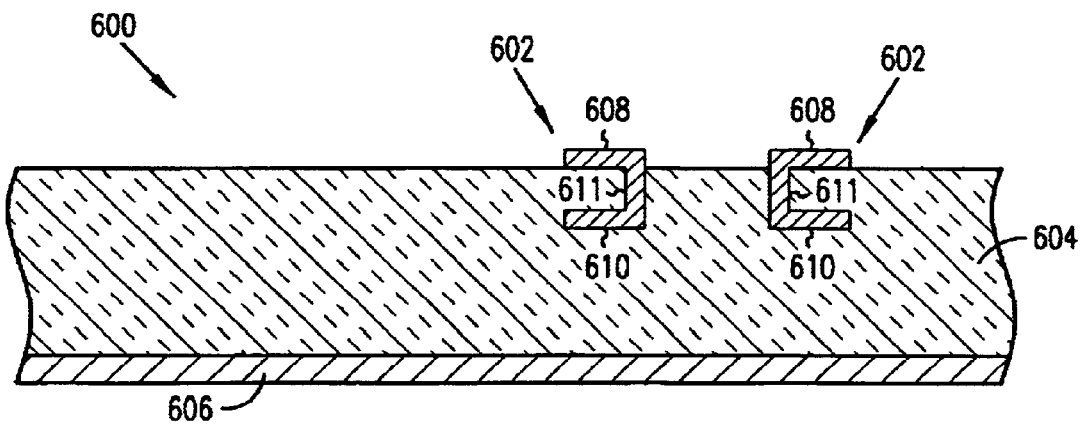

FIG. 6 illustrates a cross-section of a portion of a circuit board having traces for communicating high-speed digital differential signals in accordance with another embodiment of the present invention. Circuit board 600 includes insulating substrate 604 having trace pair 602 and conductive ground plane 606. Trace pair 602 includes traces of set 610 located within substrate 604, traces of set 608 located on a surface of substrate 604, and conductive portions 611 which may couple traces of sets 610 and 608 throughout their length. Traces of sets 608 and 610 may be spaced very closely together. This embodiment of the present invention is referred to as the "U-shaped" embodiment because the cross-section of the traces of pair 602 is similar to a sideways capital "U". In this embodiment, conductive portions 611 may be positioned on the near sides of traces 610 and 608 as illustrated, or alternatively may be positioned on the far sides of traces 610 and 608 (not illustrated).

Figure 1:
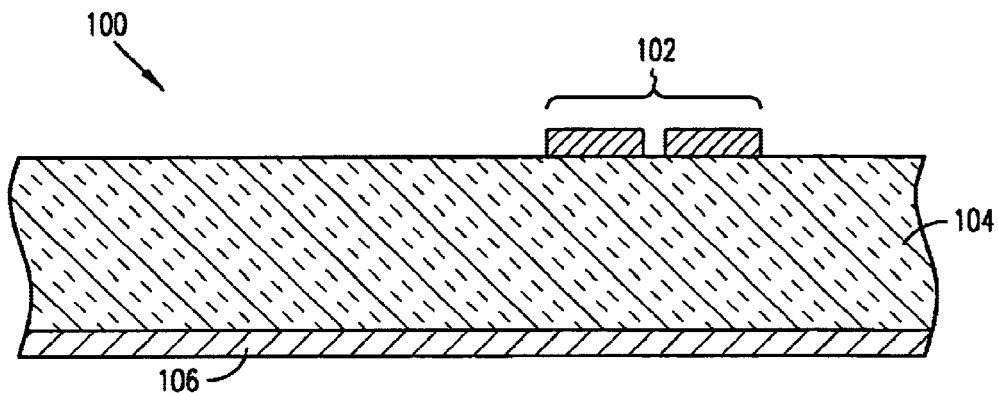
FIG. 1 illustrates a cross-section of a portion of a circuit board having trace pairs for communicating digital differential signals in accordance with the prior art.

The trace pairs of the various embodiments of the present invention may provide for reduced conduction loss over conventional trace pairs used to carry digital differential signals. For example, the conventional trace pair for communicating digital differential signals illustrated in FIG. 1 may have a DC resistance of approximately 0.22 Ohms per 2.54 centimeters and an AC resistance of approximated 0.33 Ohms per 2.54 centimeters. The "stacked trace" embodiment illustrated in FIG. 2 may have a DC resistance of approximately 0.11 Ohms per 2.54 centimeters and an AC resistance of approximated 0.21 Ohms per 2.54 centimeters. The "I-shaped" embodiment illustrated in FIG. 3 may have a DC resistance of approximately 0.07 Ohms per 2.54 centimeters and an AC resistance of approximated 0.20 Ohms per 2.54 centimeters. The "T-shaped" embodiment illustrated in FIG. 4 may have a DC resistance of approximately 0.11 Ohms per 2.54 centimeters and an AC resistance of approximated 0.21 Ohms per 2.54 centimeters. The "L-shaped" embodiment illustrated in FIG. 5 may have a DC resistance of approximately 0.14 Ohms per 2.54 centimeters and an AC resistance of approximated 0.24 Ohms per 2.54 centimeters. The "U-shaped" embodiment illustrated in FIG. 6 may have a DC resistance of approximately 0.086 Ohms per 2.54 centimeters and an AC resistance of approximated 0.19 Ohms per 2.54 centimeters.

The trace pairs of the various embodiments of the present invention may also provide for improved signal integrity over conventional trace pairs used to carry digital differential signals. For example, when measured and viewed with an eye diagram, the percentage at which the signal is at a final state (e.g., not in transition between states) is the percentage of the eye diagram. The percentage of the eye diagram is approximately 74.5% for the conventional trace pair of FIG. 1 for a digital differential signal having a transition-rate around ten giga-transitions per second. The percentage of the eye diagram, for example, is approximately 86.8% for the "L-shaped" embodiment illustrated in FIG. 5. The percentage of the eye diagram, for example, is approximately 88.8% for the "U-shaped" embodiment illustrated in FIG. 6.

The present invention is not limited to the illustrated embodiments. Other embodiments of the present invention that are not illustrated include, for example, a "non-inverted T-shaped" embodiment and an "inverted L-shaped" embodiment.

The trace configurations of the present invention may be suitable for carrying high-speed digital differential signals in a package to and from a semiconductor die. The trace configurations of the present invention may also be suitable for carrying high-speed digital differential signals on an interposer substrate, which may be located between a packaged die and a circuit board. The trace configurations of the present invention may also be suitable for carrying high-speed digital differential signals on circuit boards such as a motherboard of a computer. The trace configurations of the present invention may also be suitable for carrying high-speed digital differential signals between, for example, a high-speed microprocessor and other elements on a motherboard. The trace configurations of the present invention may also be suitable for carrying high-speed digital differential signals to various I/O elements of a computer system.

Figure 7A:
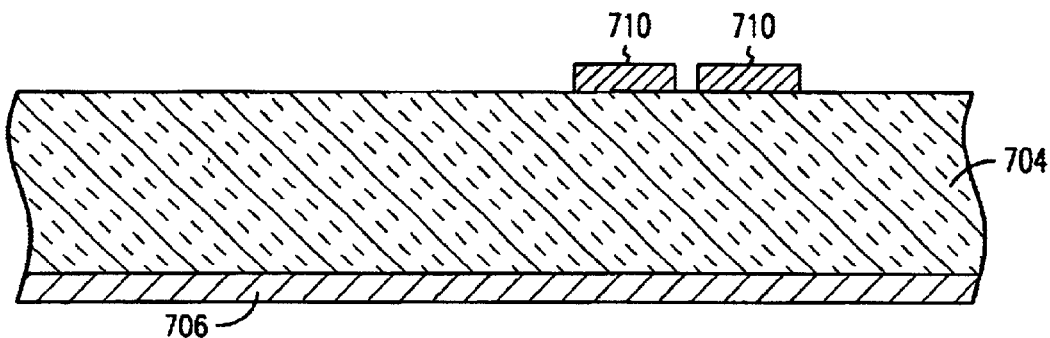
FIGS. 7A, 7B and 7C illustrate the fabrication of a circuit board in accordance with an embodiment of the present invention.
Figure 7B:
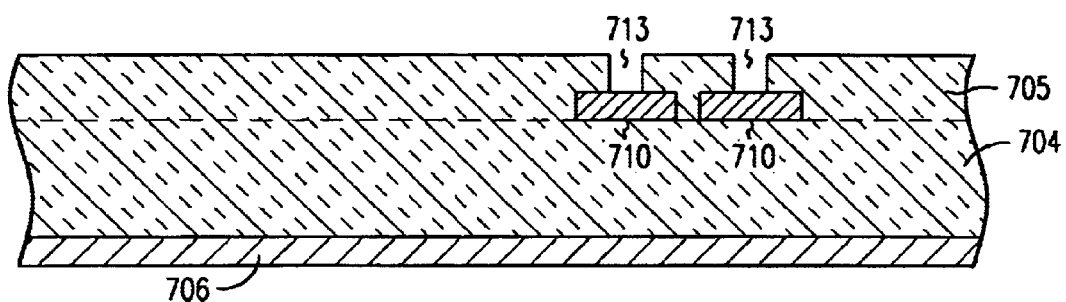
Figure 7C:
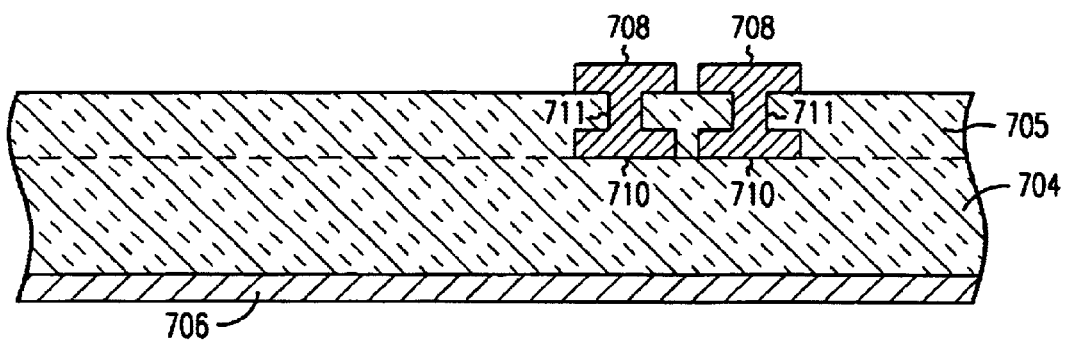

FIGS. 7A, 7B and 7C illustrate the fabrication of a circuit board in accordance with an embodiment of the present invention. FIGS. 7A, 7B and 7C may be part of a procedure for fabrication of a circuit board in accordance with several embodiments of the present invention. Although the individual operations are illustrated and described as separate operations, it should be noted that one or more of the individual operations may be performed concurrently. The procedure is described for the fabrication of a trace pair for carrying a high-speed digital differential signal, however, many more trace pairs for carrying other high-speed digital differential signals may be concurrently fabricated. Although FIGS. 7A, 7B and 7C illustrate the fabrication of the "I-shaped" embodiment described in FIG. 3, this procedure may be used to fabricate other embodiments of the present invention.

In FIG. 7A, trace pair 710 is fabricated on a circuit board having insulating substrate 704 and ground plane 706 on a side opposite of trace pairs 710. In FIG. 7B, insulating material 705 is added to substrate 704. Insulating material may be a thin layer of insulating material, and may be the same or similar to the insulating material of substrate 704. As part of the operation illustrated in FIG. 7B, trenches 713 may be formed through insulating material 705. The position of trenches 713 depends on whether the "I-shaped" embodiment, the "T-shaped" embodiment, the "L-shaped" embodiment, or the "U-shaped" embodiment is being fabricated. When fabricating the "stacked trace" embodiment, trenches 713 do not need to be formed, however "holes" for conductive paths through insulating material 705 may be formed at or near the ends of the traces of trace pair 710.

In FIG. 7C, trenches 713 are filled with conductive material 711 to complete the "T-shaped" and the "L-shaped" embodiment. For the "stacked trace" embodiment, the holes near the end of traces 710 are filled with conductive material. For the "I-shaped" embodiment, the "sideways U-shaped" embodiment, and the "stacked trace" embodiment, traces 708 are fabricated on the surface of insulating material 705.

Various conductive materials may be used for traces 708, traces 710, ground plane 706, and conductive material 711 including, for example, gold, copper, and aluminum, and various alloys and combinations thereof. Various insulating materials may also be used for substrate 704 and insulating material 705 including, for example, dielectric material having a dielectric constant (Er) ranging at least from 3 to 4, and may include materials such as Duroid, and may also include materials having different dielectric constants such as aluminia. Although insulating material 705 may be the same or similar to the material of substrate 704, this is not a requirement: insulating material 705 may be different from the material of substrate 704.

Figure 8:
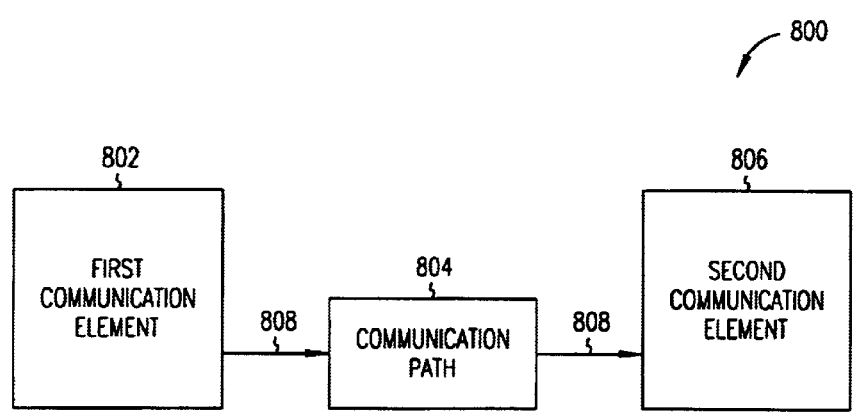
FIG. 8 is a highly simplified functional block diagram of a system in accordance with an embodiment of the present invention.

FIG. 8 is a highly simplified functional block diagram of a system in accordance with an embodiment of the present invention. System 800 comprises first and second communication elements 802, 806, with communication path 804 therebetween. First communication element 802 may provide digital differential signal 808, and second communication element 806 may receive digital differential signal 808. Communication path 804 may carry the digital differential signal between first and second communication elements 802, 806. Communication path 804 may include a first set of conductive traces disposed on insulating material, and a second set of conductive traces parallel to the first set and disposed within the insulating material and may be separated from the first set by the insulating material. In one embodiment, corresponding traces of the first and second sets may be in a stacked configuration. The corresponding traces of the first and second sets may carry a portion of the digital differential signal, and may be electrically coupled at one end. The first and second communication elements may be part of a communication system, a computer system, or other system that communicates digital differential signals between elements.

The trace configurations illustrated in FIGS. 2–7 are suitable for use as part of communication path 804, although other trace configurations are also suitable. Corresponding traces of the first and second sets may have spacing therebetween of less than twenty microns. The communication path may include conductive material to electrically couple the corresponding traces of the first and second sets. The conductive material may be disposed in between the corresponding traces of the first and second sets for substantially an entire length of the corresponding traces.

Thus, trace configurations for improved communication of high-speed digital differential signals have been described. Circuit boards having traces suitable for communication of high-speed digital differential signals have also been described. The traces may communicate high-speed digital differential signals with reduced conduction loss. The traces may also communicate high-speed digital differential signals with reduced dielectric loss. The traces may also communicate high-speed digital differential signals while maintaining signal integrity.

The foregoing description of the specific embodiments reveals the general nature of the invention sufficiently that others can, by applying current knowledge, readily modify and/or adapt it for various applications without departing from the generic concept, and therefore such adaptations and modifications are intended to be comprehended within the meaning and range of equivalents of the disclosed embodiments. It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A circuit board for carrying a differential signal comprising:

first and second parallel conductive traces in a first plane disposed on a first surface of insulating material;

third and fourth parallel conductive traces in a second plane parallel to the first plane and disposed within the insulating material below the first surface and separated from the first and second conductive traces by some of the insulating material; and a ground plane disposed on a second surface of the insulating material opposite the first surface and electrically isolated from the first, second, third and fourth conductive traces, wherein each of the conductive traces has a first end and a second opposite end, and wherein each of the conductive traces has a length between the first and second ends, the length being substantially greater than a width of the traces, wherein the first and third conductive traces are longitudinally aligned along their lengths and arranged in a stacked configuration to separately carry an in-phase portion of the differential signal along their lengths from their first ends to their second ends;

wherein the second and fourth conductive traces are longitudinally aligned along their lengths and arranged in a stacked configuration to separately carry an out-of-phase portion of the differential signal along their lengths from their first ends to their second ends, wherein the first and third conductive traces are electrically coupled at their first ends, electrically coupled at their second ends, and electrically isolated by the insulating material along their lengths between the first and second ends, and wherein the second and fourth conductive traces are electrically coupled at their first ends, electrically coupled at their second ends, and electrically isolated by the insulating material along their length between the first and second ends.

2. The circuit board of claim 1 wherein the insulating material has a dielectric constant (Er) ranging approximately between approximately 3 and 4.

3. The circuit board of claim 2 wherein the conductive traces and the ground plane are either copper or a copper alloy.

4. The circuit board of claim 3 wherein the differential signal is a high-speed digital differential signal having a transition-rate of at least one giga-transition per second, wherein the in-phase portion and the out-of-phase portion of the differential signal are substantially 180 degrees out-of-phase, and wherein the portions transition between digital values of zero and one represented by differing voltages thereon.

5. The circuit board of claim 4 wherein the first and third traces have a spacing therebetween of approximately half of a thickness of the insulating material, and wherein the second and fourth traces have a spacing therebetween of approximately half the thickness of the insulating material.

6. The circuit board of claim 5 wherein the spacing between the first and third traces and between the second and fourth traces is less than twenty microns.

7. The circuit board of claim 3 wherein the in-phase portion and the out-of-phase portion are substantially 180 degrees out-of-phase.

8. The circuit board of claim 1 wherein the first and second sets of conductive traces run substantially parallel to the ground plane.

* * * * *